(12) United States Patent
Nelson et al.

(10) Patent No.: US 6,724,015 B2
(45) Date of Patent: Apr. 20, 2004

(54) OPTICAL ATTENUATING UNDERCHIP ENCAPSULANT

(75) Inventors: Steven Nelson, Fall Creek, WI (US); Jane E. Novacek, Eau Claire, WI (US); Randy Wickman, Cadott, WI (US)

(73) Assignee: Corona Optical Systems, Inc., Lombard, IL (US)

( * ) Notice: Subject to any disclaimer, the term of this patent is extended or adjusted under 35 U.S.C. 154(b) by 46 days.

(21) Appl. No.: 10/073,462

(22) Filed: Feb. 11, 2002

(65) Prior Publication Data

US 2002/0172472 A1 Nov. 21, 2002

Related U.S. Application Data

(60) Provisional application No. 60/282,561, filed on Apr. 9, 2001, and provisional application No. 60/317,391, filed on Sep. 5, 2001.

(51) Int. Cl.[7] .............................................. H01L 33/00
(52) U.S. Cl. ........................... 257/99; 438/26; 438/28; 438/116
(58) Field of Search ............................. 438/26, 27, 31, 438/34, 116; 257/79, 81, 83, 88, 98, 99, 100; 385/14, 52, 88–92

(56) References Cited

U.S. PATENT DOCUMENTS

| | | | | | |
|---|---|---|---|---|---|
| 4,514,085 A | * | 4/1985 | Kaye | ............................ | 356/71 |
| 4,556,289 A | * | 12/1985 | Fergason | ..................... | 349/86 |
| 5,990,498 A | * | 11/1999 | Chapnik et al. | ............... | 257/99 |
| 6,356,686 B1 | * | 3/2002 | Kuczynski | .................... | 385/39 |

FOREIGN PATENT DOCUMENTS

| | | | | | |
|---|---|---|---|---|---|
| JP | | 362230046 A | * 10/1987 | ................. | 257/433 |

* cited by examiner

*Primary Examiner*—David A. Zarneke
(74) *Attorney, Agent, or Firm*—Welsh & Katz, Ltd.

(57) ABSTRACT

A method and apparatus are provided for providing an electro-optic interface for exchanging information signals. The method includes the steps of disposing an optical array adjacent a first side of an optically transparent substrate, such that a plurality of transmission paths of the optical array pass directly through the substrate, applying an optically transparent underfill between the substrate and adjacent optical array with the plurality of transmission paths of the optical array passing directly through the underfill and coupling a plurality of optical signals of the optical array through the optically transparent underfill and optically transparent substrate between the optical array and an optical connector.

27 Claims, 4 Drawing Sheets

OPTICAL ATTENUATING UNDERCHIP ENCAPSULANT

CROSS REFERENCE TO RELATED APPLICATIONS

This application claims the benefit of U.S. Provisional Application No. 60/282,561 filed Apr. 9, 2001, and U.S. Provisional Application No. 60/317,391 filed Sep. 5, 2001.

BACKGROUND OF THE INVENTION

Traditionally, VCSEL dies are vertically mounted to a printed circuit board, or PCB, with light emitting from the same surface as the electrical contacts. The PCB is usually made of FR4 or ceramic. Other mounting substrates could include metals such as invar or plastics housings such as LCP. As shown in the prior art of FIG. 1, a TO can assembly 12 has wire bonds 16 used in electrically connecting the VCSEL die 14. Wire bonds 16 are more susceptible to damage than solder bumps, and are generally avoided if possible. In addition, wire bonding is inconsistent in terms of variance in electrical properties. As the wire lengths tend to vary, variance exists in resistance, inductance, or capacitance of the lines. As shown in FIG. 1, the TO can's base comprises a header 20 and a conductive spacer 18. A metallic structure 22, referred to as a can, provides a hermetic seal for a VCSEL laser array 14. Optical signals 26 exit the TO can 22 through a lens 24, and may be appropriately coupled into a waveguide (not shown). A method of attaching the VCSEL die using metal to metal contacts on the pads such as solder bumps or stud bumps can make closer connections that are more consistent in electrical variance and offer greater structural stability than wire bonds. This method of attaching is commonly referred to as flip chipping. Wire bonding adds to the overall height in the package more so than flip chipping, as shown in FIG. 1. In addition, flip chipping allows for a waveguide and/or lens structure to be placed closer to surface of light emission. As a result, the coupling efficiency between the active optical device and waveguide/optical fiber could increase.

As stated above, a VCSEL laser die often contains electrical contacts on the same surface of light emission. Flip chipping a laser die to a substrate can eliminate the need for complicated lensing devices necessary to capture enough light. Because flip chipping can eliminate use of wire bonds on an active optical surface, an optical fiber or waveguide can be closer to the optical port. If the distance from a coupling device to the optical port decreases, more divergent light can be collected before being obstructed by covering features or interfering with adjacent optical devices. This in turn may preserve signal integrity.

Flip chipping of IC's is widely understood. Yet, the flip chipping of VCSEL or photodiode dies is a newer practice with room for modifications and improvements. Typically, conventional stud bumps or solder bumps establish electrical connections between conductive traces and optical devices. A solder bump can structurally attach the optical device to a substrate or similar device, but a stud bump is typically used in conjunction with an adhesive (the structural member). Adhesive selection becomes important under large temperature variations. Given an assembly going through a tin-lead solder reflow oven, bonded surfaces could shift in relation to each other, and the adhesive, or solder bump, must hold the positions of the devices in relation to each other.

If an adhesive is placed on the sides of the die and not on the optical device's surface attached to the substrate, a number of problems could arise if an air-gap remains between the substrate and the optical device. Foreign materials could possibly find their way into the open space surrounded by the solder, contaminate the optical ports, and interfere with signal integrity. During aqueous washing of the assembly, unwanted chemicals may enter the region of the optical array, contaminating the optical array and depreciating signal integrity. For this reason, an adhesive is better suited between the two surfaces of contact. Yet, if attaching a VCSEL die to a substrate, where the optical emission surface of the optical array is attached to the substrate, the adhesive must allow optical signals to pass through.

As flip chipping an optical device to a substrate can enable closer proximity of a waveguide to the port, this can enable coupling of more divergent optical radiation, thus increasing the total amount of light gathered and eliminate the need for lens mechanisms. As it is desirable to uniformly collect light over the optical source's total angular emission field, it is not necessarily advantageous to gather as much light as possible. Capturing too much light through an optical fiber or waveguide could cause a few problems, one of which is eye safety. As a laser can cause permanent damage to the human eye, it is imperative to ensure that a laser's output does not come in contact with a human eye in a hazardous manner.

Another possible consequence in gathering too much light involves the inability of a receiving optical device to process the light energy. A photodetector may provide an electrical output that is proportional to the amount of light energy from a transmitting device. If the input signal to a photodetector contains too much light energy, the photodetector could become saturated. That is, the linear proportionality between the incoming light energy and the outgoing electrical signal could diminish, and the photodetector may not respond accordingly beyond a certain range of light energy. Additionally, if the photodetector has not already saturated, a signal processor receiving the electrical signal from the photodetector could become saturated. That is, the signal processor's limits will have been reached because the value of the input electrical signal could be too high. Because of these two consequences in gathering too much light energy, it is necessary to appropriately control an optical signal.

In this invention we provide a novel way to couple light from an optical device, into a waveguide, and subsequently into an optical fiber. The invention may simultaneously function as a waveguide, a structural member, a protective means for optical ports, and an optical attenuator. It may allow coupling of divergent light while transmitting an appropriate amount of optical energy to a receiving device. In addition, the invention may promote eye safety while maintaining signal integrity.

SUMMARY OF THE INVENTION

A method and apparatus are provided for providing an electro-optic interface for exchanging information signals. The method includes the steps of disposing an optical array adjacent a first side of an optically transparent substrate, such that a plurality of transmission paths of the optical array pass directly through the substrate, applying an optically transparent underfill between the substrate and adjacent optical array with the plurality of transmission paths of the optical array passing directly through the underfill and coupling a plurality of optical signals of the optical array through the optically transparent underfill and optically transparent substrate between the optical array and an optical connector.

DETAILED DESCRIPTION OF THE INVENTION

Figure 1:
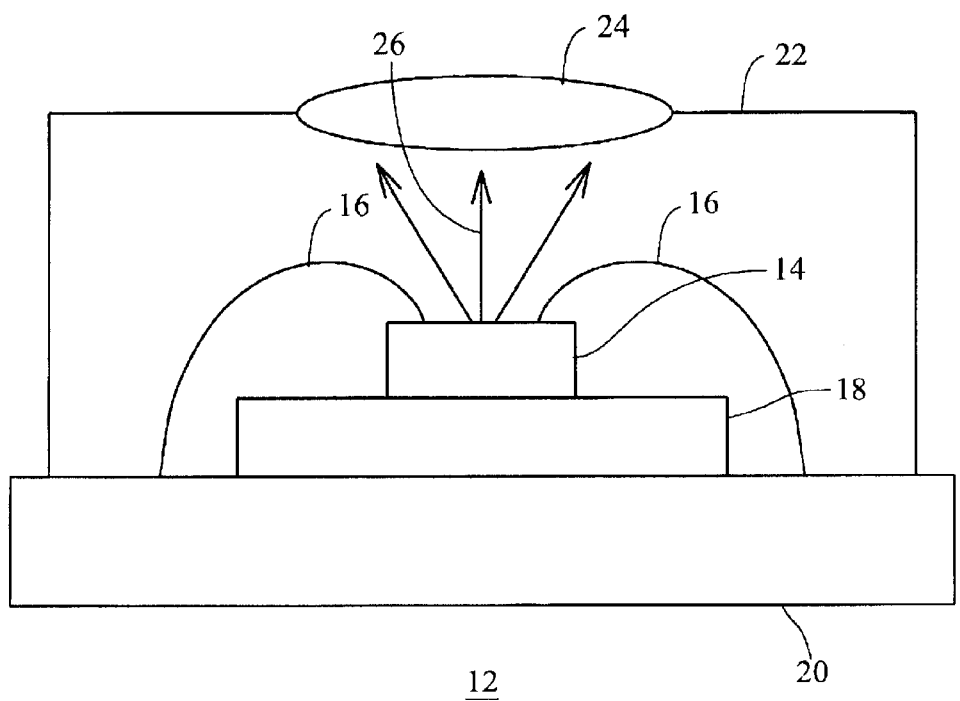
FIG. 1 is a front view of the prior art related to the invention.
Figure 2:
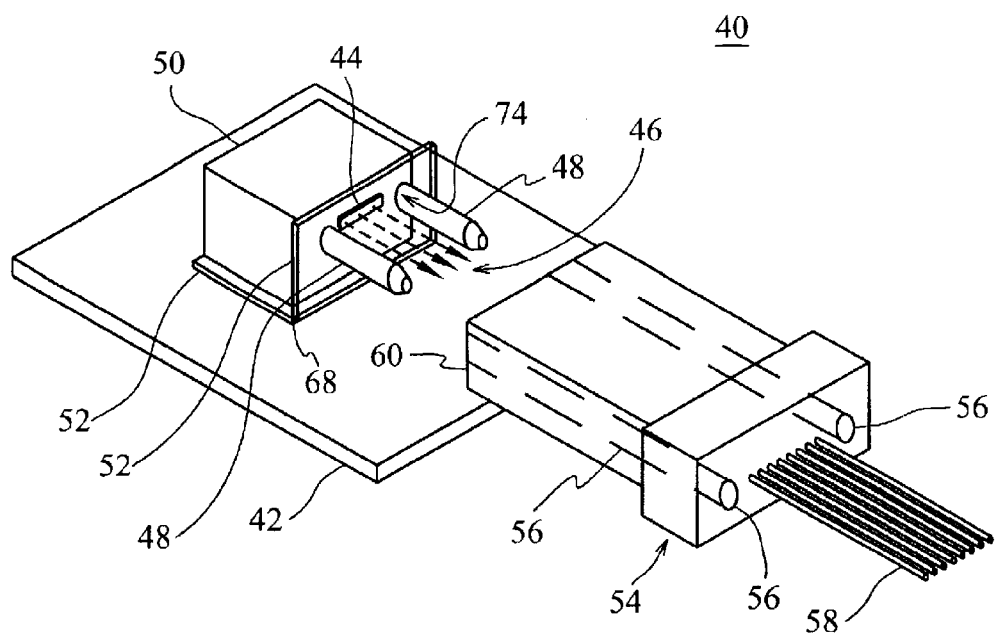
FIG. 2 is a profile view of an electro-optic communications assembly under an illustrated embodiment of the invention.

FIG. 2 shows an electro-optic communications assembly 40 in accordance with the invention and in a context of use. The assembly 40 may include a common substrate 42, or printed circuit board (PCB), an optically transparent substrate 52 attached to the PCB 42, an active optical array 44 attached to the substrate 52, and an optical connector 54 for holding optical fibers 58 in alignment with the optical array 44. Alignment apertures 74 may be disposed in the substrate 52 to allow guide pins 48, inserted through the alignment apertures 74, to align the optical fibers 58 of the optical connector 54 to the optical array 44.

The PCB 42, may be any suitable material such as FR4, ceramic interconnect, or the like. The PCB 42 may have a plurality of electrical and optical devices for signal processing, as well as electrical traces and electrical pads (not shown in the figure). The optically transparent substrate 52, having first and second sides 64 and 66 respectively (FIG. 3), may comprise an L-shaped glass or a glass-like structure having desirable optical and structural properties. The substrate 52 could be about 100 microns in thickness. The second side 66 of the substrate 52 may be attached to the PCB 42 by a conductive adhesive, solder/stud bumps, or a similar material. Attached to the first surface 64 of the substrate 52 may be the optical array 44. In a preferred embodiment of the present invention, the substrate 52 may also contain a right angle bend 68 at an appropriate location to allow planarity of optical signals 46 of the optical array 44 with respect to the PCB 42.

Figure 3:
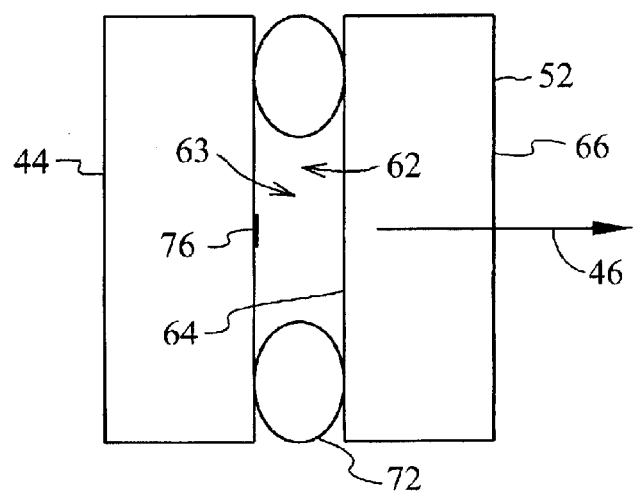
FIG. 3 is a side view of an optical array of FIG. 2 attached to a optically transparent substrate.

FIG. 3 illustrates a cut-away side view of a portion of the optical array 44 attached to the optically transparent substrate 52. The optical array 44 may have disposed on a first surface 64 of the substrate 52. Conventional electrical contacts 72 (i.e., solder or stud bumps), and electrical traces (not shown) may be used for electrically connecting the optical array 44 to a signal processing device (not shown). In a preferred embodiment of the invention, stud bumps electrically attach the optical array 44 to the substrate 52. An optically transparent underfill 62 mechanically attaches the optical array 44 to the first surface of the substrate 64. The details of the optically transparent underfill 62 will be described in further detail below.

Figure 4:
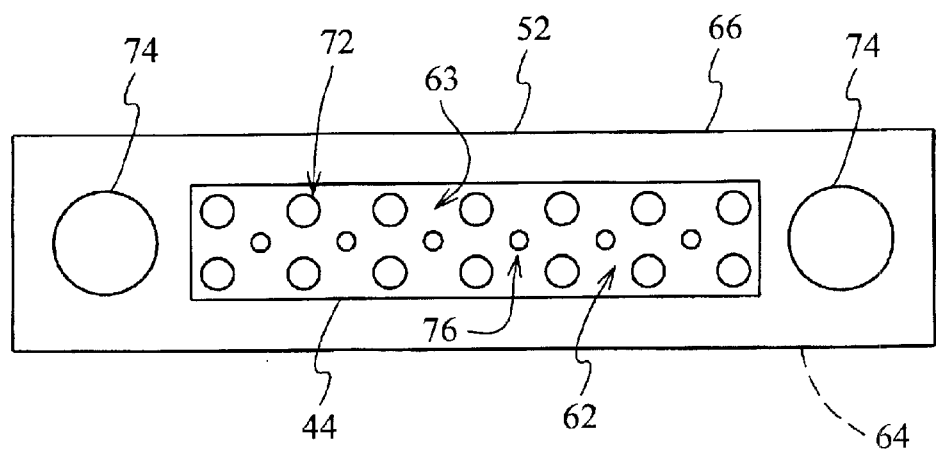
FIG. 4 is a front view of the optical array of FIG. 2 attached to a substrate.

It will be understood that the active optical array 44 can be any suitable photonic device or array of photonic devices including photo-transmitters, photo-receivers, or a combination thereof. A photo-transmitter can be any suitable device such as a vertical cavity surface emitting laser (VCSEL), light emitting diode (LED), or the like. Furthermore, any suitable photo-receiving device can be used, such as a photodiode, P-I-N diode, PN diode, MSM diode or the like. Thus, the active optical array 44 can be a broad range of photoactive devices with transmitting and receiving capabilities. The optical array 44 may have a number of optical ports 76, and each optical port 76 may be a photonics transmitter, receiver, or a combination transmitter/receiver. FIG. 4 is a view of the active surface of the optical array 44, viewed through the transparent substrate 52. Also shown, through the substrate 52, are optical ports 76, the optically transparent underfill 62, and electrical contacts 72. (FIG. 4 shows 6 optical ports and 14 electrical contacts, yet the number of optical ports and electrical contacts used in the invention are not limited in any way).

Turning back to FIG. 3, the optically transparent underfill 62 may mechanically attach the optical array 44 to a first surface 64 of the substrate 52. The thickness of the underfill 62 may be 50–60 microns, or about the thickness of conventional stud bumps 72. In addition, the thickness of the underfill 62 may be changed by appropriately changing the height of the stud bumps 72. The underfill 62 may be applied to the region between the first surface 64 of the substrate 52 and the active optical surface of the optical array. It could also be applied to the substrate 52 before the optical array 44 and the substrate 52 are connected, (i.e., the underfill 62 could be applied before or after the optical array 44 is attached to the substrate 52). The underfill 62 could be applied using a conventional syringe technique. The preferred method of application is a conventional pin transfer technique. Upon applying the underfill, the underfill cures for an appropriate amount of time. Use of an epoxy underfill for IC's is common, and details of composition, application, or curing will not be discussed in detail.

In a preferred embodiment of the present invention, the underfill 62 is an epoxy supplied by Epoxy Technology of Billerica, Mass. (commonly referred to as Epo-Tek). Two epoxies that have been used in the invention are Epo-Tek's U300 and OE121. Additional epoxies displaying adequate optical and thermal properties could be used for this application as well. The optical signal's transmission paths 46 originating from the optical ports 76 may sequentially pass directly through the underfill 62 and the optically transparent substrate 52. The underfill 62 may also function as a hermetic encapsulant, thus protecting the optical ports 76 of the optical array 44 from unwanted harsh chemicals, debris, and the like.

The underfill 62 could also minimize light reflections between the optical array 44 and transparent substrate 52. Reflected light coupled back into the optical ports 76 could reduce the performance of the optical array 144, further increasing optical noise. By choosing an optical underfill with a refractive index reasonably close to that of the substrate's, this could reduce the effects of, if not preventing, a standing-wave cavity from forming between the substrate 52 and optical array 44. This in turn could increase the optical signal integrity by minimizing reflections back into the optical ports 76 of the optical array 44.

The underfill 62 shown in FIGS. 3 and 4 may include an additive dye 63 used to block a portion of the optical signal 46 transmitting through the underfill 62. The dye 63 may attenuate an optical signal to any appropriate level. Details of the dye 63 will now be described in further detail.

The additive dye 63 could be a liquid or powder additive mixed with the epoxy adhesive 62, by any conventional mixing techniques, before being applied to the region between the optical array 44 and the first surface 64 of the substrate 52. In a preferred embodiment of the invention, the dye 63 is a convention infrared absorptive powder dye 63 supplied by American Dye Source, Inc. It blocks light of appropriate wavelengths while allowing other wavelengths to pass. For example, the preferred dye attenuates a portion of the 850 nanometer optical signal, while allowing light of other wavelengths to pass, including light in the visible spectrum (as will be described later, light in the visible spectrum is used for proper alignment/placement of the optical array). The amount of light the dye 63 blocks is directly proportional to the amount of dye 63 added to the underfill. That is, more dye 63 added to the underfill 62 could block a greater amount of light. In addition, a thicker amount of underfill 62 can block a greater amount of light. As previously stated, the thickness of the underfill 62 can be controlled by the thickness of the stud bumps 72.

An underfill dye 63 will usually attenuate a range of wavelengths of light. For a given dye 63, a "light frequency vs. amount of light blocked" plot could be modeled by a bell-shaped curve. A dye used in light attenuation applications is described/marketed as the absorptance of light over a wavelength range. As the wavelength of light passing through the dye/underfill deviates from the dye's nominal or rated absorption range, the amount of light blocked will decrease. By choosing a dye 63 with a rated wavelength and magnitude of light attenuation as close as possible to the wavelength of the optical signal, less dye 63 could be dissolved in the underfill to achieve a certain optical attenuation. That is, by matching the optical signal wavelength to the rated wavelength of a dye 63, the amount of dye 63 used could be minimized.

In a preferred embodiment of the present invention, the additive dye 63 is used between the transparent substrate 52 and an optical transmitting port 76. Thus, the additive dye 63 blocks optical signals on the transmitting end of the transmission path, and not on the receiving end of the signals.

As previously stated, the dye 63 could be mixed with the underfill 62 using a conventional procedure. Once thoroughly mixed, the underfill 62 could appropriately be applied in the gap between the optical array 44 and the optically transparent substrate 52.

Turning again to FIG. 4, a set of alignment apertures 74 may be formed in the transparent substrate 52 for receiving the alignment guide pins 48 described earlier. The alignment apertures 74 may properly align the optical ports 76 of the optical array 44 to the optical fibers 58 of the fiber holding alignment mechanism 54, as shown in FIG. 2.

The alignment guide pins 48, held in place by an alignment pin holder 50 shown in FIG. 2, could then be inserted concurrently through guide pin apertures 56 formed on a first surface 60 of the fiber holding alignment mechanism 54. This could collinearly align optical ports 76 of the optical array 44, to the respective optical fibers 58 of the fiber holding alignment mechanism 54. (In a preferred embodiment of the invention, the fiber holding alignment mechanism 50 could be a standard MT connector, or ferrule, manufactured by US Conec or Nippon Telephone & Telegraph; US Conec Part number MTF-12MM7).

Figure 5:
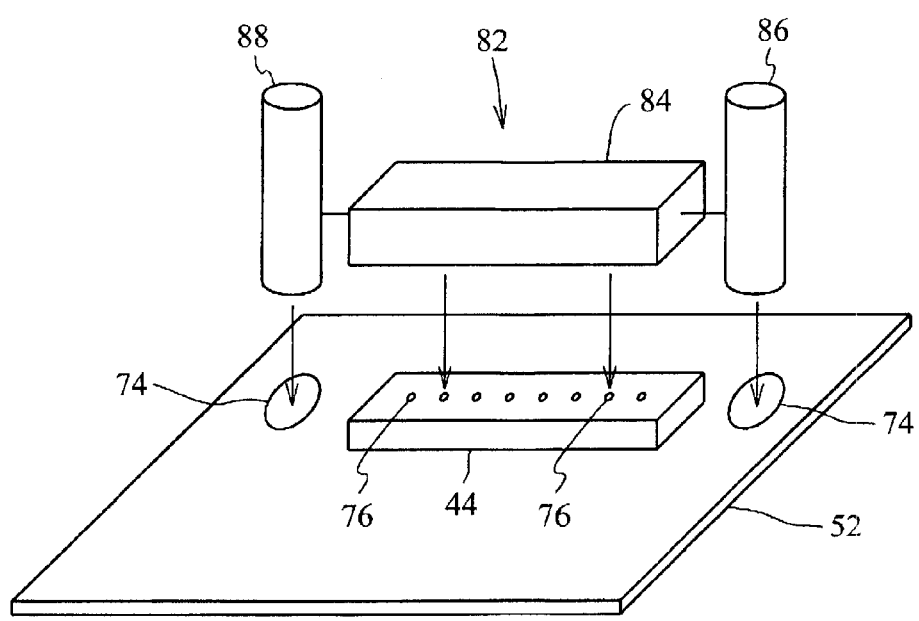
FIG. 5 is a profile view of the substrate and a pattern recognition system used in aligning the assembly of FIG. 2.

To form the alignment apertures 74 in the substrate 52, a boring fixture 82 may be used (FIG. 5). The boring fixture 82 may include a pattern recognition module 84 and lasers 86, 88. The pattern recognition module 84 may include software adapted to recognize and position itself over a line of targets (not shown). The module may use a camera (not shown) to detect certain registration targets located on the optical array 44. The camera may detect light in the visible spectrum, hence the use of an underfill dye 63 that allows the transmission of light in the visible spectrum.

Once recognition of targets has occurred, the pattern recognition module 84 functions to identify a transverse line passing through the line of targets as well as a center point of the line of targets. The pattern recognition module 84 then positions its own transverse line and center point with the identified transverse line and center point. The lasers 86, 88 may be precisely aligned along the transverse line of the pattern recognition module 84. The lasers 86, 88 are also positioned a precise distance on either side of the center point of the pattern recognition module 84.

The pattern recognition module 84 may be programmed to view the array 44 through the transparent substrate 52 and identify the set of alignment targets (e.g., the alignment targets on opposing ends of the array 44). Once the pattern recognition module 84 has aligned itself with the recognition targets (and also the lasers 86, 88 on either side of the targets), the boring fixture 82 activates the lasers 86, 88 to ablate the holes 74 in precise alignment with the ports 76.

While a specific embodiment of the invention has been shown and described, it should be understood that the implementation of other variations and modifications of the invention and its various aspects will be apparent to one skilled in the art, and that the invention is not limited by the specific embodiments described. Therefore, it is contemplated to cover the present invention and any and all modifications, variations, or equivalents that fall within the true spirit and scope of the basic underlying principles disclosed and claimed herein.

| Numbering List | Optical Attenuating Underchip Encapsulant 83653 |
|---|---|
| 10 | |
| 11 | |
| 12 | TO can |
| 13 | |
| 14 | optical device |
| 15 | |
| 16 | wire bonds |
| 17 | |
| 18 | spacer |
| 19 | |
| 20 | header |
| 21 | |
| 22 | can |
| 23 | |
| 24 | lense |
| 25 | |
| 26 | normal transmission axis |
| 27 | |
| 28 | |
| 29 | |
| 30 | |
| 31 | |
| 32 | |
| 33 | |
| 34 | |
| 35 | |
| 36 | |
| 37 | |
| 38 | |
| 39 | |
| 40 | optical converter assembly |
| 41 | |
| 42 | PCB |
| 43 | |
| 44 | optical array/devices |
| 45 | |
| 46 | transmission paths |
| 47 | |
| 48 | guide pins |
| 49 | |
| 50 | guide pin holder |
| 51 | |
| 52 | glass substrate |
| 53 | |
| 54 | MT ferrule/waveguide |
| 55 | |

-continued

| Numbering List | Optical Attenuating Underchip Encapsulant 83653 |
|---|---|
| 56 | apertures in the ferrule |
| 57 | |
| 58 | ribbon fiber |
| 59 | |
| 60 | 1st surface of the waveguide |
| 61 | |
| 62 | optically clear underfill |
| 63 | additive dye |
| 64 | 1st surface of the substrate |
| 65 | |
| 66 | 2nd surface of the substrate |
| 67 | |
| 68 | 90 degree bend |
| 69 | |
| 70 | conductive traces |
| 71 | |
| 72 | conductive pads/bumps |
| 73 | |
| 74 | alignment apertures in the substrate |
| 75 | |
| 76 | optical ports |
| 77 | |
| 78 | |
| 79 | |
| 80 | darkened zones |
| 81 | |
| 82 | boring fixture |
| 83 | |
| 84 | recognition module |
| 85 | |
| 86 | laser 1 |
| 87 | |
| 88 | laser2 |
| 89 | |
| 90 | |

What is claimed is:

1. A method of providing an electro-optic interface for exchanging information signals, such method comprising the steps of:
    disposing a unitary array of a plurality of optical devices adjacent a first side of an optically transparent substrate, such that a transmission path of each of the plurality of optical devices of the optical array pass directly through the substrate;
    applying an optically transparent underfill between the substrate and adjacent optical array, with the plurality of transmission paths of the optical array passing directly through the underfill and where the underfill does not provide an electrical path for the optical device;
    coupling an optical signal of each the plurality of optical devices of the optical array through the optically transparent underfill and optically transparent substrate between the optical array and an optical connector.

2. The method of providing an electro-optic interface for exchanging information signals as in claim 1 further comprising disposing a plurality of alignment apertures in the optically transparent substrate.

3. The method of providing an electro-optic interface for exchanging information signals as in claim 2 further comprising inserting a guide pin in each of the plurality of alignment apertures.

4. The method of providing an electro-optic interface for exchanging information signals as in claim 3 further comprising aligning the optical connector, having a plurality of optical fibers and guide pin apertures disposed on a first surface of the connector, to the optical array using the guide pins and guide pin apertures.

5. The method of providing an electro-optic interface for exchanging information signals as in claim 4 further comprising defining the optically transparent underfill as an adhesive.

6. The method of providing an electro-optic interface for exchanging information signals as in claim 5 wherein the step of applying an optically transparent underfill further includes mixing an additive dye into the optically transparent underfill for blocking a portion of the optical signals from the optical array.

7. The method of providing an electro-optic interface for exchanging information signals as in claim 5 further including disposing a plurality of conductive traces on a first side of the optically transparent substrate.

8. The method of providing an electro-optic interface for exchanging information signals as in claim 5 further comprising electrically connecting the optical array with at least some of the conductive traces disposed on the substrate.

9. The method of providing an electro-optic interface for exchanging information signals as in claim 5 further comprising providing a set of conductive contacts to electrically connect the optical array to the conductive traces.

10. An apparatus for providing an electro-optic interface for exchanging information signals, such apparatus comprising:
    an array of optical devices disposed adjacent an optically transparent substrate, with a transmission path of each of the plurality of optical devices of the optical array passing directly through the substrate;
    an optically transparent underfill disposed between the optically transparent substrate and adjacent optical array where the underfill does not provide an electrical path for the optical device; and
    an optical connector for holding a plurality of optical fibers and for guiding the plurality of optical fibers into alignment with the transmission paths of optical array.

11. The apparatus for providing an electro-optic interface for exchanging information signals as in claim 10 further comprising a plurality of alignment apertures formed in the substrate.

12. The apparatus for providing an electro-optic interface for exchanging information signals as in claim 11 further comprising alignment pins inserted through the apertures in the substrate.

13. The apparatus for providing an electro-optic interface for exchanging information signals as in claim 12 further comprising guide pin apertures located on a first surface of the optical connector.

14. The apparatus for providing an electro-optic interface for exchanging information signals as in claim 13 wherein the optically transparent underfill further comprises an adhesive.

15. The apparatus for providing an electro-optic interface for exchanging information signals as in claim 13 further comprising an additive dye mixed into the optically transparent underfill and adapted to block a portion of the optical signals from the optical array.

16. The apparatus for providing an electro-optic interface for exchanging information signals as in claim 13 further comprising a plurality of conductive traces disposed on the first side of the optically transparent substrate.

17. The apparatus for providing an electro-optic interface for exchanging information signals as in claim 16 wherein at least some the plurality of conductive traces disposed on the first side of the substrate further comprise a signal path coupling the optical array.

18. The apparatus for providing an electro-optic interface for exchanging information signals as in claim 17 further comprising a plurality of conductive contacts electrically connecting the optical array and the conductive traces.

19. A method of providing an electro-optic interface for exchanging information signals, such method comprising the steps of:
   disposing an optical array, having a plurality of optical ports, adjacent a substrate with an axis of transmission of the optical array directed towards a body of the substrate; and
   interposing an optically transparent underfill between the substrate and adjacent optical array, such that the axis of transmission of the optical array passes directly through the optically transparent underfill and the body of the substrate and where the underfill does not provide an electrical path for the optical device.

20. The method of providing an electro-optic interface for exchanging information signals as in claim 19 further comprising defining the optically transparent underfill as an adhesive.

21. The method of providing an electro-optic interface for exchanging information signals as in claim 19 further comprising mixing an additive dye into the optically transparent underfill for blocking a portion of the signals from the optical array.

22. The method of providing an electro-optic interface for exchanging information signals as in claim 19 further comprising defining the optical array having a plurality of optical ports.

23. The method of providing an electro-optic interface for exchanging information signals as in claim 22 further comprising adapting the adhesive to protect the plurality of optical ports of the optical array.

24. An apparatus for providing an electro-optic interface for exchanging information signals, such apparatus comprising:
   a substrate;
   an optical array, having a plurality of optical ports, disposed adjacent the substrate, with an axis of transmission of the optical array directed towards a body of the substrate; and
   an optically transparent underfill disposed between the optical array and substrate, such that the axis of transmission of the optical array passes directly through the optically transparent underfill and body of the substrate and where the underfill does not provide an electrical path for the optical device.

25. The apparatus for providing an electro-optic interface for exchanging information signals as in claim 24 wherein the optically transparent underfill is further defined as an adhesive.

26. The apparatus for providing an electro-optic interface for exchanging information signals as in claim 24 further comprising an additive dye mixed into the optically transparent underfill and adapted to block a portion of the optical signals from the optical array.

27. The apparatus for providing an electro-optic interface for exchanging information signals as in claim 26 wherein the adhesive is adapted to protect the plurality of optical ports of the optical array.

* * * * *